United States Patent [19]

Gardner et al.

[11] Patent Number: 5,672,531
[45] Date of Patent: Sep. 30, 1997

[54] METHOD FOR FABRICATION OF A NON-SYMMETRICAL TRANSISTOR

[75] Inventors: Mark L. Gardner, Cedar Creek; Michael P. Duane; Derick J. Wristers, both of Austin, all of Tex.

[73] Assignee: Advanced Micro Devices, Inc., Austin, Tex.

[21] Appl. No.: 682,493

[22] Filed: Jul. 17, 1996

[51] Int. Cl.⁶ .......................... H01L 21/265; H01L 21/44
[52] U.S. Cl. ............................ 437/44; 437/41; 437/186
[58] Field of Search ............................ 437/40, 41, 44, 437/186

[56] References Cited

U.S. PATENT DOCUMENTS

| | | | |
|---|---|---|---|
| 4,272,881 | 6/1981 | Angle | 437/40 AS |
| 5,200,358 | 4/1993 | Bollinger et al. | 437/186 |
| 5,286,664 | 2/1994 | Horiuchi | 437/44 |
| 5,296,398 | 3/1994 | Noda | 437/44 |
| 5,424,229 | 6/1995 | Oyamatsu | 437/35 |
| 5,525,552 | 6/1996 | Huang | 437/186 |
| 5,547,885 | 8/1996 | Ogoh | 437/41 AS |

FOREIGN PATENT DOCUMENTS

| | | |
|---|---|---|
| 575099 | 12/1993 | European Pat. Off. . |
| 3939319 | 5/1990 | Germany . |
| 403198349 | 8/1991 | Japan . |
| 07326736 | 12/1995 | Japan . |

*Primary Examiner*—John Niebling
*Assistant Examiner*—Michael S. Lebentritt
*Attorney, Agent, or Firm*—Skjerven, Morrill, MacPherson, Franklin & Friel; David M. Sigmond; M. Kathryn Tsirigotis

[57] ABSTRACT

A method for fabrication of a non-symmetrical LDD-IGFET is described. In one embodiment, the method includes providing a semiconductor substrate having a gate insulator and a gate electrode, the gate electrode having opposing first and second sidewalls defining the length of the gate electrode and a top surface. Lightly doped source and drain regions are implanted into the semiconductor substrate and are substantially aligned with the sidewalls of the gate electrode. After implanting the lightly doped regions, first and second spacers are formed adjacent to the first and second sidewalls of the gate electrode. After forming the spacers, a portion of the gate electrode is removed to form a third sidewall of the gate electrode opposite the second sidewall, thereby eliminating the first sidewall and reducing the length of the gate electrode. After removing the first spacer, heavily doped source and drain regions are implanted into the semiconductor substrate. The heavily doped drain region is substantially aligned with the outer edge of the second spacer, a portion of the lightly doped drain region is protected beneath the second spacer, and the heavily doped source region is substantially aligned with the third sidewall. In another embodiment, the heavily doped drain region is implanted after the spacers are formed but before the third sidewall is formed and the heavily doped source region is implanted after forming the third sidewall.

26 Claims, 4 Drawing Sheets

METHOD FOR FABRICATION OF A NON-SYMMETRICAL TRANSISTOR

BACKGROUND OF THE INVENTION

1. Field of the Invention

The present invention relates to integrated circuits, and more particularly to lightly doped drain insulated-gate field-effect transistors.

2. Description of Related Art

An insulated-gate field-effect transistor (IGFET), such as a metal-oxide semiconductor field-effect transistor (MOSFET), uses a gate electrode to control an underlying surface channel joining a source and a drain. The channel, drain and source are located in a semiconductor substrate. The gate electrode is separated from the semiconductor substrate by a thin insulating layer such as a gate oxide. The operation of the IGFET involves application of an input voltage to the gate electrode, which sets up a transverse electric field in the channel in order to modulate the longitudinal conductance of the channel.

In typical IGFET processing, the source and drain are formed by introducing dopants of a second conductivity type (P or N) into the semiconductor substrate of a first conductivity type (N or P) using a patterned gate as a mask. This self-aligning procedure tends to improve packing density and reduce parasitic overlap capacitances between the gate electrode and the source/drain regions. Heavily doped polysilicon (also called polycrystalline silicon, poly-Si or poly) thin films are used as the gate electrode. Since polysilicon has the same high melting point as a silicon substrate, it can be deposited prior to source and drain formation. The polysilicon is anisotropically etched through openings in a photoresist mask to provide a gate electrode which provides a mask during formation of the source and drain by ion implantation. Photolithography is frequently used to create patterns in the photoresist mask that define the gate electrode.

Photolithographic systems often use a radiation source and a lens in conjunction with a mask or reticle to selectively irradiate the photoresist. The radiation source projects radiation through the mask or reticle to the lens, and the lens focuses an image of the mask or reticle onto a wafer. A mask transfers a pattern onto the entire wafer (or another mask) in a single exposure step, whereas a reticle transfers a pattern onto only a portion of the wafer. The three major methods of optically transferring a pattern on a mask or reticle to a photoresist coated wafer include contact printing, proximity printing and projection printing. In general, the term "resolution" describes the ability of an optical system to distinguish closely spaced objects. The minimum resolution of a photolithographic system is the dimension of minimum linewidth or space that the machine can adequately print or resolve. While optical photolithography continues to be the dominant technology because it is well established and is capable of implementing sub-micron resolution of at least 0.35 microns using current equipment, there are incentives for trying to push the current optical photolithography technology into significantly better patterning capabilities for more precise fabrication.

In recent years, with larger and larger scale semiconductor integrated circuit devices (IC's), IGFETs used as circuit elements have become scaled down. This, however, has not been simply accompanied by appropriate supply voltage scaling because interfaces between IC circuit devices must be standardized. As IGFET dimensions are reduced and the supply voltage remains constant (e.g., 3 V), the electric field in the gate insulator tends to increase. If the electric field becomes strong enough, it can give rise to so-called hot-carrier effects. For instance, hot electrons can overcome the potential energy barrier between the silicon substrate and the gate insulator thereby causing hot carriers to become injected into the gate insulator. Trapped charge in the gate insulator accumulates over time and can lead to a permanent change in the threshold voltage of the device and premature dielectric breakdown.

A number of techniques have been utilized to reduce hot carrier effects. The voltages applied to the device can be decreased or appropriate drain engineering design techniques, which result in special drain structures that reduce hot electron effects, can be implemented. One such technique is a lightly doped drain (LDD). LDDs absorb some of the potential into the drain and thus reduce the maximum electric field. The drain is typically formed by two ion implants. One of these is self-aligned to the gate electrode, and the other is self-aligned to the gate electrode on which sidewall spacers have been formed. The spacers are typically oxides. The purpose of the lighter first dose is to form a lightly doped region of the drain (or LDD) at the gate electrode sidewall near the channel, which can reduce the maximum electric field. The second heavier dose forms a low resistivity region of the drain, which is subsequently merged with the lightly doped region. Thereafter, electrical contacts are formed on the heavily doped region. Since the heavily doped region is farther away from the channel than a conventional drain structure, the depth of the heavily doped region can be made somewhat greater without adversely affecting the device characteristics. The lightly doped region is not necessary for the source (unless bi-directional current is used), however LDD structures are typically formed for both the drain and source to avoid the need for an additional masking step.

Disadvantages of LDDs are their increased fabrication complexity compared to conventional drain structures, and parasitic resistance. LDDs exhibit relatively high parasitic resistance due to their light doping levels. During operation, the LDD parasitic resistance can decrease drain current, which in mm may reduce the speed of the IGFET. The saturation drain current is affected little by the parasitic resistance of the drain region and greatly by the effective gate voltage drop due to the parasitic resistance of the source region. Reduction of the drain current can, therefore, be decreased by implementation of a non-symmetrical LDD-IGFET with a lightly doped region only at the drain. However, a non-symmetrical LDD-IGFET can further increase fabrication complexity.

One method for non-symmetrical LDD-MOSFET fabrication is U.S. Pat. No. 5,424,229 entitled "Method For Manufacturing MOSFET Having An LDD Structure" (Oyamatsu) which includes masking the substrate before the gate electrode is formed and leaving a window open in the mask. The lightly doped drain region is then implanted at an angle into the substrate through the window opening. The mask is removed and the gate electrode is formed in the window opening and over a portion of the lightly doped drain region. The heavily doped regions are then formed aligned with the sidewalls of the gate electrode. However, implanting doped regions at an angle into the substrate increases fabrication complexity.

Another method is U.S. Pat. No. 5,286,664 entitled "Method For Fabricating The LDD-MOSFET" (Horiuchi) wherein the gate electrode is formed and then one half of the gate electrode (on the source side) is masked with a photoresist mask. The lightly doped drain region is implanted.

Then a single spacer is formed on the drain side using a liquid phase deposition (LPD) method for depositing silicon dioxide. The mask is then removed and the heavily doped regions are implanted. The LPD method however is not precise and can make controlling the thickness or size of the spacer difficult.

Accordingly, there is a need for a non-symmetrical LDD-IGFET which decreases the parasitic resistance, therefore increasing drain current, yet which can be simply and precisely fabricated.

SUMMARY OF THE INVENTION

In the present invention, a method for fabrication of a non-symmetrical LDD-IGFET is described. In one embodiment, the method includes providing a semiconductor substrate having a gate insulator and a gate electrode, the gate electrode having opposing first and second sidewalls defining the length of the gate electrode and a top surface. Lightly doped source and drain regions are implanted into the semiconductor substrate and are substantially aligned with the sidewalls of the gate electrode. After implanting the lightly doped regions, first and second spacers are formed adjacent to the first and second sidewalls of the gate electrode. After forming the spacers, a portion of the gate electrode is removed to form a third sidewall of the gate electrode opposite the second sidewall, thereby eliminating the first sidewall and reducing the length of the gate electrode. After removing the first spacer, heavily doped source and drain regions are implanted into the semiconductor substrate. The heavily doped drain region is substantially aligned with the outer edge of the second spacer, a portion of the lightly doped drain region is protected beneath the second spacer, and the heavily doped source region is substantially aligned with the third sidewall. In another embodiment, the heavily doped drain region is implanted after the spacers are formed but before the third sidewall is formed and the heavily doped source region is implanted after forming the third sidewall.

The present fabrication method of a non-symmetrical LDD IGFET provides the advantages described for non-symmetrical LDD-IGFETs and also provides a shorter channel length of the gate electrode than traditional IGFETs by forming each sidewall of the gate electrode in sequence. Therefore speed performance and drive current is enhanced while maintaining reliability.

These and other features and advantages of the invention will be further described and more readily apparent from a review of the detailed description of the preferred embodiments which follow.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
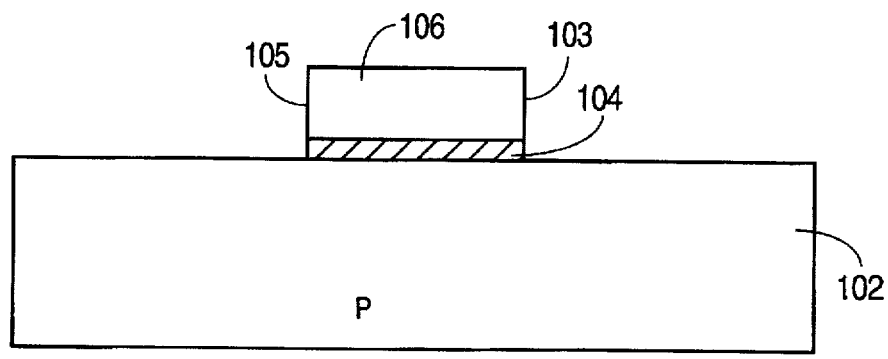
FIGS. 1A-1F show cross-sectional views of successive process steps for formation of a non-symmetrical LDD IGFET in accordance with a first embodiment of the invention.

In the drawings, depicted elements are not necessarily drawn to scale and like or similar elements may be designated by the same reference numeral throughout the several views.

FIGS. 1A-1F show cross-sectional views of successive process steps for formation of a non-symmetrical LDD IGFET in accordance with a first embodiment of the invention. In FIG. 1A, a gate electrode such as polysilicon 106 is disposed on a gate oxide 104, which in turn is disposed on a semiconductor substrate 102 suitable for integrated circuit manufacture. For instance, substrate 102 includes an 8 micron thick P-type planar epitaxial surface layer with a <100> orientation and a resistivity of 12 ohm-cm. Preferably, the epitaxial surface layer is disposed on a P+ base layer (not shown). A blanket layer of gate oxide 104 (such as $SiO_2$) is formed on the top surface of substrate 102 using tube growth at a temperature of 700° to 1,000° C. in an $O_2$ ambient. Gate oxide 104 has a thickness in the range of 30 to 200 angstroms. Thereafter, a blanket layer of polysilicon 106 is deposited by low pressure chemical vapor deposition (LPCVD) on the top surface of gate oxide 104. Polysilicon 106 has a thickness in the range of 250 to 4,000 angstroms. Polysilicon 106 is doped by ion implantation of arsenic at a dose in the range of $1 \times 10^{15}$ to $5 \times 10^{15}$ atoms/cm$^2$ and an energy in the range of 2 to 50 kiloelectron-volts. Alternatively, if desired, polysilicon 106 can be doped by subsequent source/drain implant. Thereafter, polysilicon 106 and gate oxide 104 are patterned using photolithography and an anisotropic dry etch. For submicron dimensions, patterning a photoresist mask (not shown) by I-line photolithography using a mercury vapor lamp is preferred. After the photoresist mask is patterned and an isotropic etch is applied, polysilicon 106 is etched back to provide a gate electrode and gate oxide 104 is etched back to provide a gate insulator. Preferably, a first etchant is applied that is highly selective of polysilicon, then a second etchant is applied that is highly selective of oxides. After etching occurs, polysilicon 106 includes substantially vertical opposing first and second sidewalls 103 and 105, respectively, defining a length of the gate electrode. The gate oxide 104 is substantially aligned with the first and second sidewalls 103 and 105.

Figure 1B:
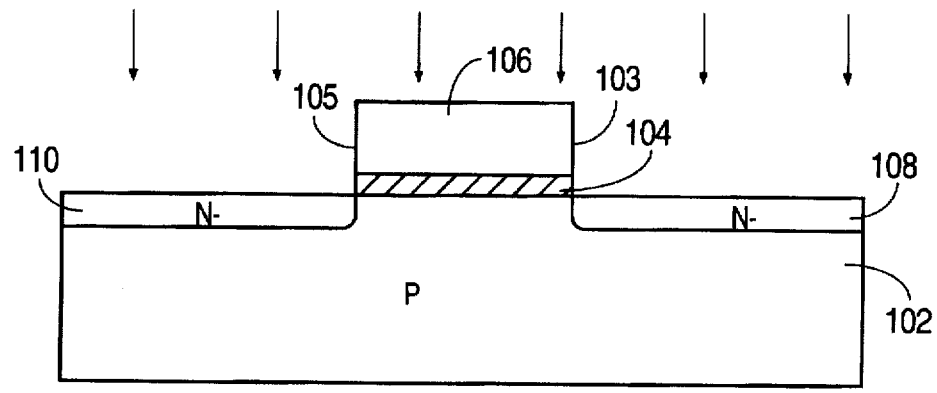

In FIG. 1B, a light dose of a first dopant is implanted into the semiconductor substrate to provide a lightly doped source region 108 and a lightly doped drain region 110. For instance, the structure is subjected to ion implantation of arsenic at a dose in the range of $1 \times 10^{13}$ to $5 \times 10^{14}$ atoms/cm$^2$ and an energy in the range of 2 to 50 kiloelectron-volts. As a result, the lightly doped source region 108, substantially aligned with the first sidewall 103, and the lightly doped drain region 110, substantially aligned with the second sidewall 105, are formed at and below the surface of substrate 102. Lightly doped source and drain regions 108 and 110, respectively, are doped N− with a dopant concentration in the range of about $1 \times 10^{17}$ to $1 \times 10^{18}$ atoms/cm$^3$, and a junction depth in the range of 0.01 to 0.15 microns.

Figure 1C:
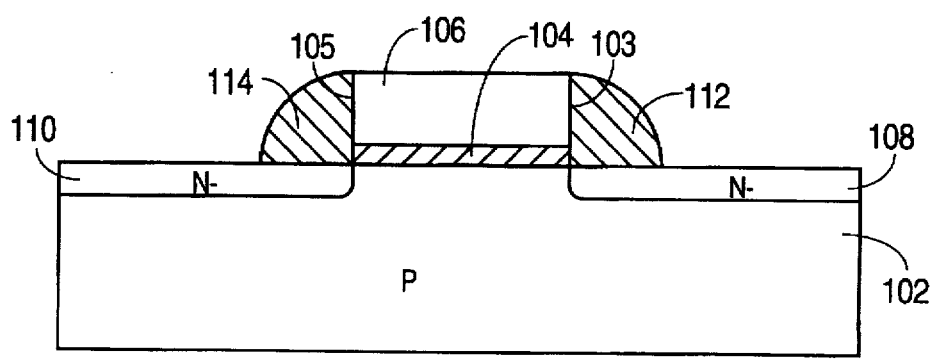

In FIG. 1C, insulating spacers are formed on the first sidewall 103 and the second sidewall 105. For instance, a layer of oxide (such as $SiO_2$) is formed (not shown) on the whole surface of the resultant structure. The oxide film is etched, by reactive ion etching, to form first and second spacers 112 and 114, respectively, adjacent the first and second sidewalls 103 and 105, respectively. The first and second spacers 112 and 114, respectively, each extend a lateral distance in the range of 200 to 2000 angstroms, and have essentially the same height as polysilicon 106.

Figure 1D:
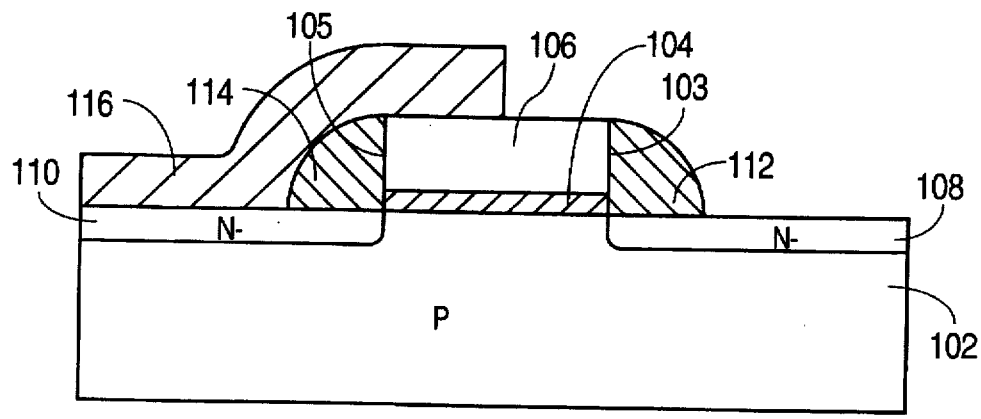

In FIG. 1D, a masking film 116, such as a photoresist film, is formed over the lightly doped drain region 110, the second spacer 114, the second sidewall 105 and a part of the top surface of the polysilicon 106, to define a third sidewall of the gate electrode. The masking film 116 has an opening which exposes a portion of the top surface of the polysilicon 106, the first spacer 112, and the first sidewall 103.

Figure 1E:
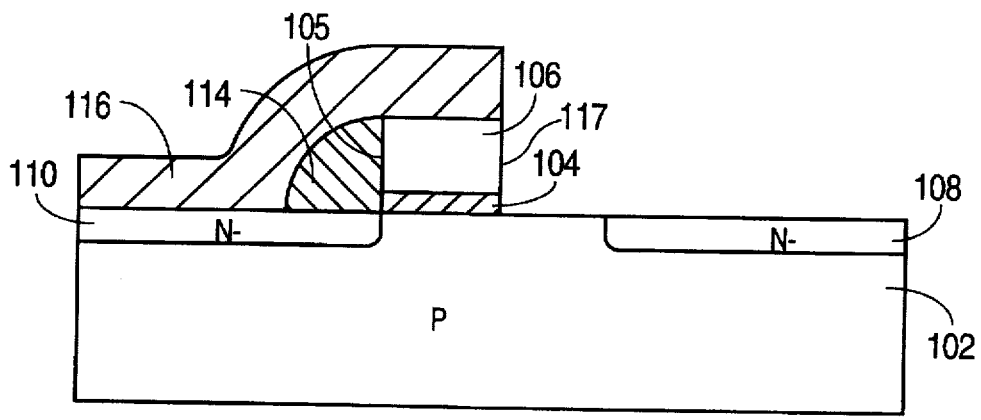

As shown in FIG. 1E, the polysilicon 106 exposed through the opening in the masking fill 116 is etched to provide a third sidewall 117 in polysilicon 106 opposite the second sidewall 105, thereby eliminating the first sidewall 103 and reducing the length of the gate electrode. The first spacer 112 may be etched before or after the polysilicon 106 exposed through the opening of the masking fill 116 is etched. For instance, a wet etch may be used to etch the first spacer 112 and then a dry etch may be used to remove the polysilicon 106 exposed through the opening of the masking film 116, or the wet etch may be applied after the dry etch. Alternately, both the first spacer 112 and the polysilicon 106 exposed through the opening of the masking film 116 may be etched simultaneously with a dry etch. If the polysilicon 106 exposed through the opening of the masking fill 116 is etched first, then the first spacer 112 and gate oxide 104 outside of the polysilicon 106 may be etched before implanting a second dopant, as shown in FIG. 1E, or etched after implanting the second dopant (not shown).

In the standard IGFET, the length or channel length of a gate electrode is in the range of 0.35 to 0.40 microns, however, in the present invention wherein the gate electrode sidewalls are formed in sequence, an advantage is obtained whereby the channel length may be reduced. See, for example, U.S. patent application Ser. No. 08/682,233, entitled "Method Of Forming A Gate Electrode For An IGFET", (Gardner et at), filed concurrently herewith and incorporated by reference, which describes a method for forming the edges of a gate electrode in sequence, rather than simultaneously, using optical photolithography technology, which provides extremely narrow gate electrode lengths (or channel lengths). Also, see U.S. patent application Ser. No. 08/682,238, entitled "Method For Fabrication Of A Non-Symmetrical Transistor", (Gardner et at), filed concurrently herewith and incorporated by reference, which describes a method for fabricating a non-symmetrical IGFET wherein the edges of a gate electrode are formed in sequence, rather than simultaneously.

Figure 1F:
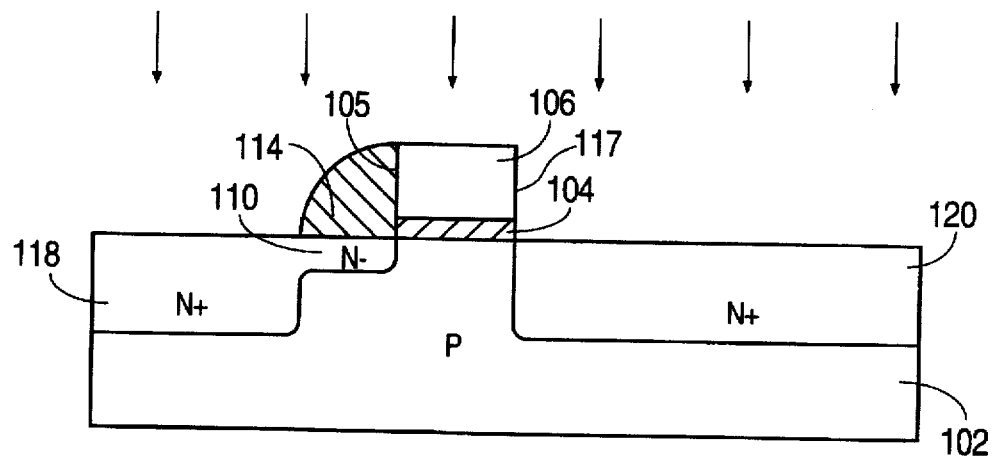

In FIG. 1F, the masking film 116 is removed and a heavy dose of a second dopant is implanted into the semiconductor substrate 102 to provide a heavily doped drain region 118 adjacent to and outside the second spacer 114 and a heavily doped source region 120 substantially aligned with the third sidewall 117. The heavily doped drain region 118 and heavily doped source region 120 are formed in substrate 102 using the polysilicon 106 and the second spacer 114 as implant masks. The implant is performed using arsenic at a dosage of $1\times10^{15}$ to $5\times10^{15}$ atoms/cm$^2$ and an energy in the range of 2 to 50 kiloelectron-volts. As a result, the heavily doped drain region 118 and heavily doped source region 120 are formed at and below the surface of substrate 102 and are doped N+ with a dopant concentration in the range of $1\times10^{18}$ to $1\times10^{19}$ atoms/cm$^3$, and a depth in the range of 0.02 to 0.3 microns. The heavily doped drain region 118 and the lightly doped drain region 110 together form a drain in the semiconductor substrate 102. The entire lightly doped source region 108, an N– region, is converted into an N+ region and effectively eliminated if the first spacer 112 is removed before implanting the second dopant.

A primary difference between the second embodiment and the first embodiment is that, in the second embodiment, an additional step of implanting a third dopant after forming the spacers and before forming the third sidewall of the gate electrode is performed.

Unless otherwise noted, the elements for the second embodiment (e.g., substrate 202, gate oxide 204, etc.) are similar to elements of the first embodiment (e.g., substrate 102, gate oxide 104, etc.), and the description of related elements and process steps need not be repeated.

Figure 2A:
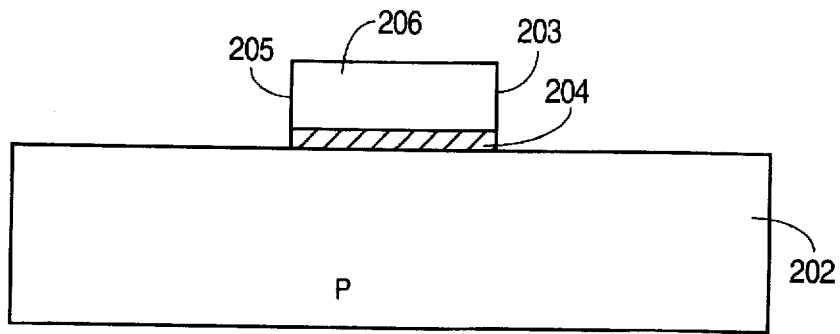
FIGS. 2A-2G show cross-sectional views of successive process steps for formation of a non-symmetrical LDD IGFET in accordance with a second embodiment of the invention.

FIGS. 2A–2G show cross sectional views of successive process steps for formation of a non-symmetrical LDD-IGFET in accordance with a second embodiment of the invention. In FIG. 2A, gate oxide 204 is disposed on substrate 202, and polysilicon 206 is disposed on gate oxide 204. Polysilicon 206 has substantially vertical opposing first and second sidewalls 203 and 205, respectively, defining a gate electrode.

Figure 2B:
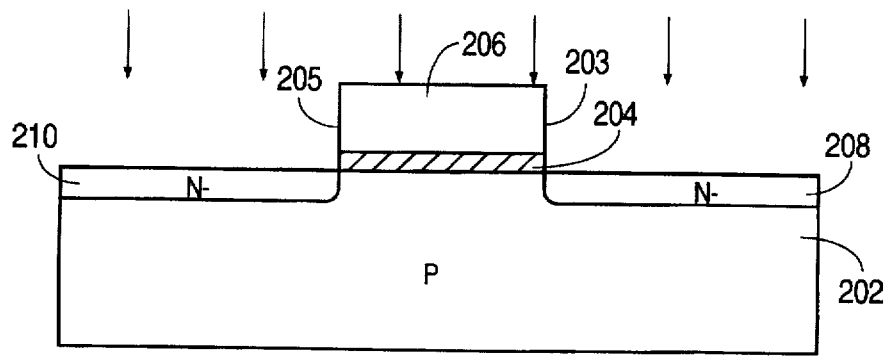

In FIG. 2B, a light dose of a first dopant is implanted into the semiconductor substrate to provide a lightly doped source region 208 substantially aligned with the first sidewall 203 and a lightly doped drain region 210 substantially aligned with the second sidewall 205.

Figure 2C:
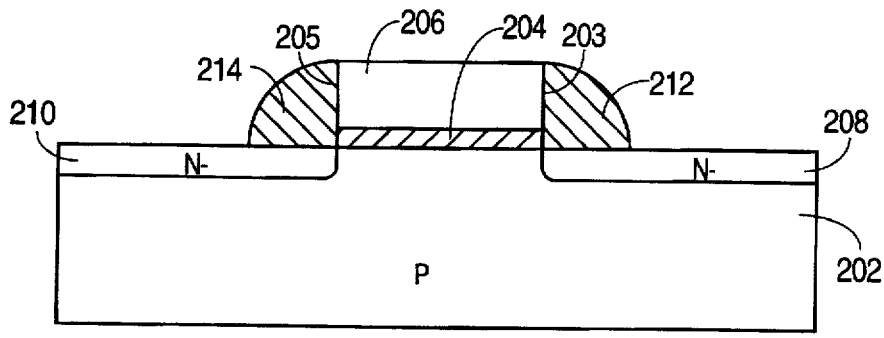
Figure 2D:
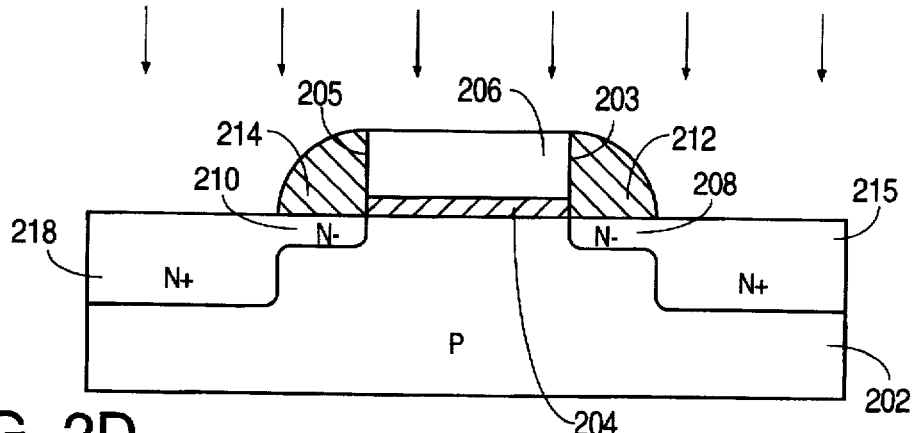

In FIG. 2C, insulating first and second spacers 212 and 214, respectively, are formed adjacent the first and second sidewalls 203 and 205, respectively. After the first and second spacers 212 and 214, respectively, are formed, a heavy dose of a third dopant is implanted into the semiconductor substrate 202, as shown in FIG. 2D. The polysilicon 206 and first and second spacers 212 and 214, respectively, are used as implant masks. The implant is performed using arsenic at a dosage of $1\times10^{15}$ to $5\times10^{15}$ atoms/cm$^2$ and an energy in the range of 2 to 50 kiloelectron-volts. As a result, a heavily doped source region 215 and heavily doped drain region 218 are formed at and below the surface of substrate 202. The heavily doped drain region 218 is substantially adjacent to and outside the second spacer 214 and the heavily doped source region 215 is substantially adjacent to and outside the first spacer 212. The heavily doped source and drain regions 215 and 218, respectively, are doped N+ and have a dopant concentration in the range of $1\times10^{18}$ to $1\times10^{19}$ atoms/cm$^3$, and a depth in the range of 0.02 to 0.3 microns. Preferably, heavily doped source region 215 and heavily doped drain region 218 are implanted with a substantially greater energy, and therefore have a substantially greater depth than lightly doped source region 208 and lightly doped drain region 210. A portion of the lightly doped source and drain regions 208 and 210, respectively, are retained beneath the first and second spacers 212 and 214, respectively. The heavily doped drain region 218 and the lightly doped drain region 210 together form a drain in the semiconductor substrate 202.

Figure 2E:
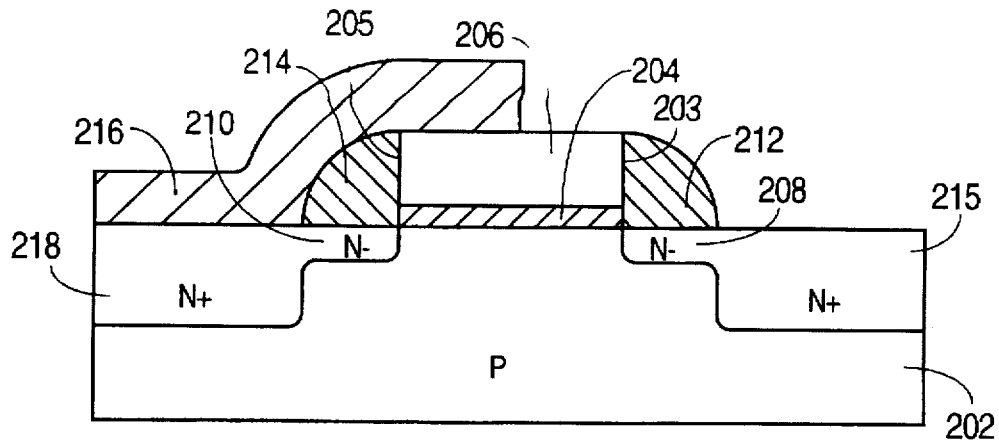

In FIG. 2E, a masking film 216, such as a photoresist film, is formed over the heavily doped drain region 218, the lightly doped drain region 210, the second spacer 214, the second sidewall 205, and at least a part of the top surface of the polysilicon 206, to define a third sidewall of the gate electrode. The masking film 216 has an opening which exposes a portion of the top surface of polysilicon 206, the first spacer 212 and the first sidewall 203.

Figure 2F:
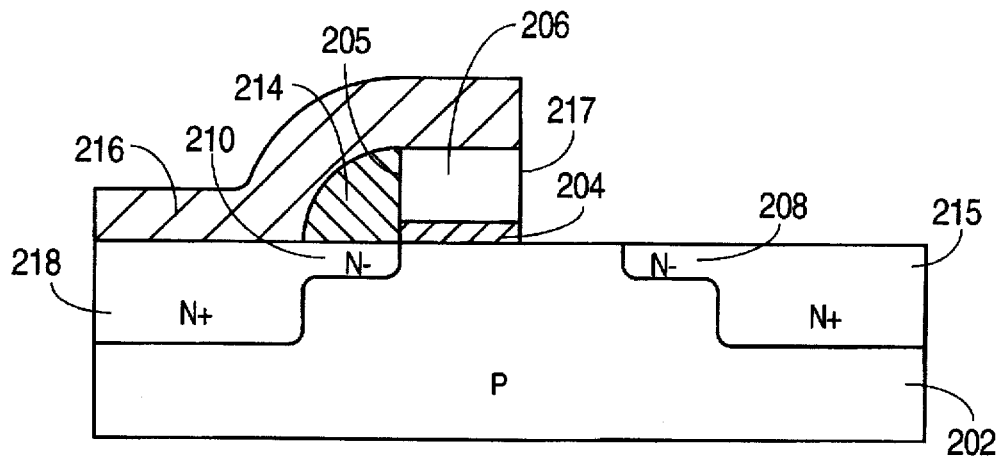

As shown in FIG. 2F, the polysilicon 206, exposed through the opening in the masking film 216 is etched to provide a third sidewall 217 of polysilicon 206 opposite to the second sidewall 205, thereby eliminating the first sidewall 203 and reducing the length of the gate electrode. The first spacer 212 may be etched before or after the polysilicon 206 exposed through the opening in the masking film 216 is etched. In the standard IGFET, the channel length of a gate electrode is in the range of 0.35 to 0.40 microns, however, in the present invention wherein the sidewalls are formed in sequence an advantage is obtained whereby the channel length may be reduced.

Figure 2G:
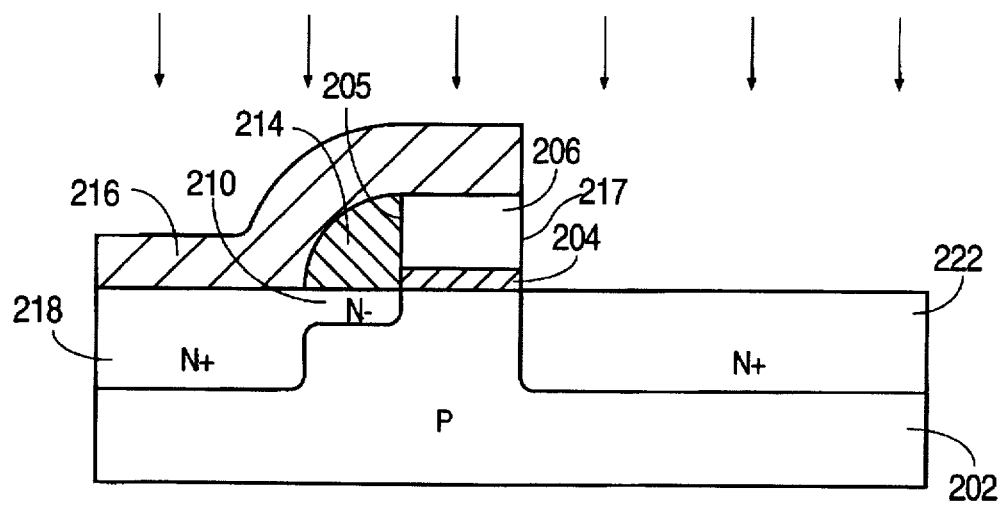

In FIG. 2G, the masking film 216 remains in place and a heavy dose of a second dopant is implanted into the semiconductor substrate 202 using the masking film 216 as an implant mask. The implant is performed using arsenic at a dosage of $1\times10^{15}$ to $5\times10^{15}$ atoms/cm$^2$ and an energy in the range of 2 to 50 kiloelectron-volts. As a result, a heavily doped source region 222 is formed at and below the surface of substrate 202 and substantially aligned with the third sidewall 217. The heavily doped source region 222 has a dopant concentration in the range of $1\times10^{18}$ to $1\times10^{19}$ atoms/cm$^3$, and a depth in the range of 0.02 to 0.3 microns. The region of the heavily doped source region 215 substantially adjacent to and outside of the first spacer 212 has an increased dopant concentration and therefore a lower resistance after the implant of the second dopant. The first spacer 212 and gate oxide 204 outside of the polysilicon 206 may be etched before implanting the second dopant, as shown in FIG. 2F, or left in place during the implant of the second dopant (not shown). If the first spacer 212 is removed before the implant of the second dopant, then the entire lightly doped source region 208, a N− region, is converted into an N+ region and effectively eliminated. The masking film 216 is removed after implanting the second dopant. However, the masking film 216 may be removed before implanting the second dopant (not shown). The second spacer 214 then acts as an implant mask to protect the lightly doped drain region 210, and the heavily doped drain region 218 will have an increased dopant concentration and therefore a lower resistance after implanting the second dopant.

The present invention is also well-suited for forming P-channel MOSFETs as well as N-channel MOSFETs. Boron is a commonly used P-type dopant. Boron tends to diffuse much faster than typical N-type dopants such as arsenic and phosphorus. For instance, for the heavily doped regions the structure is subjected to ion implantation of boron at a dose in the range of $1\times10^{15}$ to $5\times10^{15}$ atoms/cm$^2$ and an energy in the range of 2 to 50 kiloelectron-volts. For the lightly doped regions the structure is subjected to ion implantation of boron at a dose in the range of $1\times10^{13}$ to $5\times10^{14}$ atoms/era$^2$ and an energy in the range of 5 to 50 kiloelectron-volts. For typical N-type and P-type dopants, the gate oxide insulating film may remain on the surface of the semiconductor substrate (not shown).

Further processing steps in the fabrication of IGFETs typically include forming a thick oxide layer over the active regions, forming contact windows in the oxide layer to expose the drain, source and gate electrode, forming appropriate interconnect metallization in the contact windows, and forming a passivation layer. These further processing steps are conventional and need not be repeated herein. Likewise the principal processing steps disclosed herein may be combined with other steps readily apparent to those skilled in the art.

The present invention includes variations to the embodiments described above. For instance, the gate electrode can be a conductor such as a metal, the gate insulator and the sidewall spacers can be various dielectrics such as silicon dioxide, silicon nitrite or silicon oxynitride. A polysilicon gate electrode can be deposited doped or undoped, and if deposited undoped can be doped at various stages of the process. N-type or P-type dopants can be used in any of the embodiments described above, and the dopants can be activated by applying various combinations of heat and pressure. Suitable N-type dopants include arsenic and phosphorus; suitable P-type dopants include boron, including boron $B_{10}$ and boron $B_{11}$, and BF species such as $BF_2$.

Although only a single FET has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory, and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention.

Variations and modifications of the embodiments disclosed herein may be made based on the description set forth herein, without departing from the scope and spirit of the invention as set forth in the following claims.

What is claimed is:

1. A method for fabrication of a non-symmetrical IGFET, comprising the steps of:

forming a gate insulator and a gate electrode over a semiconductor substrate, the gate electrode having a top surface and opposing first and second sidewalls defining a length of the gate electrode;

implanting a first dopant into the semiconductor substrate to provide a lightly doped drain region substantially aligned with the second sidewall;

forming first and second spacers adjacent to the first and second sidewalls, respectively, after implanting the first dopant;

removing a portion of the gate electrode adjacent to the first sidewall, after forming the spacers, to form a third sidewall of the gate electrode opposite the second sidewall, thereby eliminating the first sidewall and reducing the length of the gate electrode; and implanting a second dopant into the semiconductor substrate after forming the third sidewall to provide a heavily doped source region substantially aligned with the third sidewall.

2. The method of claim 1 wherein implanting the first dopant provides a lightly doped source region substantially aligned with the first sidewall and wherein implanting the second dopant converts at least a portion of the lightly doped source region into a portion of the heavily doped source region.

3. The method of claim 1 wherein implanting the second dopant provides a heavily doped drain region adjacent to and outside of the second spacer.

4. The method of claim I further comprising implanting a third dopant into the semiconductor substrate adjacent to and outside of the gate electrode and the spacers before forming the third sidewall.

5. The method of claim 4 wherein implanting the third dopant provides a heavily doped drain region adjacent to and outside of the second spacer.

6. The method of claim 4 wherein implanting the third dopant provides a heavily doped source region adjacent to and outside of the first spacer and implanting the second dopant adds further doping to the heavily doped source region.

7. The method of claim 1 wherein forming the third sidewall comprises:

forming a masking film over the lightly doped drain region, the second spacer, the second sidewall and a part of the top surface of the gate electrode, the masking film having an opening which exposes a portion of the gate electrode, the first spacer and the first sidewall;

etching the portion of the gate electrode exposed through the opening in the masking film to form the third sidewall; and removing the masking film.

8. The method of claim 7 further comprising the step of: etching the first spacer through the opening in the masking film after etching the portion of the gate electrode exposed through the opening in the masking film and before implanting the second dopant.

9. The method of claim 7 further comprising the step of: etching the first spacer through the opening in the masking film before etching the portion of the gate electrode exposed through the opening in the masking film.

10. The method of claim 7 further comprising the step of: etching the first spacer after implanting the second dopant.

11. The method of claim 5 wherein forming the third sidewall comprises:

forming a masking film over the lightly doped drain region, the heavily doped drain region, the second spacer, the second sidewall and a part of the top surface of the gate electrode, the masking fill having an opening which exposes a portion of the gate electrode, the first spacer and the first sidewall;

etching the portion of the gate electrode exposed through the opening in the masking film to form the third sidewall; and removing the masking fill after implanting the second dopant.

12. The method of claim 1 wherein forming the first and second spacers comprises:

depositing an insulating material to cover the surface of the semiconductor substrate, the first and second sidewalls and the top surface of the gate electrode; and removing the insulating material from the top surface of the gate electrode and from above a portion of the surface of the semiconductor substrate outside and spaced from the first and second sidewalls to form the spacers.

13. The method of claim 12 wherein the insulating material is an oxide.

14. The method of claim 1 wherein the first and second dopants are n-type.

15. The method of claim 1 wherein the first and second dopants are p-type.

16. The method of claim 4 wherein the first, second and third dopants are n-type.

17. The method of claim 4 wherein the first, second and third dopants are p-type.

18. The method of claim 1 wherein the gate electrode is polysilicon and the gate insulator is an oxide.

19. The method of claim 7 wherein the masking film is a photoresist.

20. The method of claim 11 wherein the masking film is a photoresist.

21. The method of claim 1 wherein the gate insulator is an insulating film which extends beneath the gate electrode and over the lightly doped drain region and the heavily doped source region.

22. The method of claim 21 wherein the insulating film is an oxide.

23. A method for fabrication of a non-symmetrical IGFET comprising the sequence of steps of:

providing a semiconductor substrate;

forming a gate oxide on the semiconductor substrate;

forming, on the gate oxide, a polysilicon electrode having a top surface and opposing first and second sidewalls defining a length of the polysilicon electrode;

implanting a lightly doped drain region into the semiconductor substrate and substantially aligned with the second sidewall;

depositing an oxide layer to cover the surface of the semiconductor substrate, the first and second sidewalls of the polysilicon electrode and the top surface of the polysilicon electrode;

removing the oxide layer from the top surface of the polysilicon electrode and from above a portion of the surface of the semiconductor substrate outside and spaced from the first and second sidewalls of the polysilicon electrode to form first and second spacers adjacent to the first and second sidewalls, respectively;

forming a photoresist layer over the lightly doped drain region, the second spacer, the second sidewall and a part of the top surface of the polysilicon electrode, the photoresist layer having an opening which exposes a portion of the polysilicon electrode, the first spacer and the first sidewall;

etching the portion of the polysilicon electrode exposed through the opening in the photoresist layer to form a third sidewall of the polysilicon electrode opposite the second sidewall, thereby eliminating the first sidewall and reducing the length of the polysilicon electrode;

etching the first spacer;

removing the photoresist layer; and implanting a heavily doped source region into the semiconductor substrate and substantially aligned with the third sidewall and a heavily doped drain region into the semiconductor substrate and adjacent to and outside of the second spacer.

24. A method for fabrication of a non-symmetrical IGFET comprising the sequence of steps of:

providing a semiconductor substrate;

forming a gate oxide on the semiconductor substrate;

forming, on the gate oxide, a polysilicon electrode having a top surface and opposing first and second sidewalls defining a length of the polysilicon electrode;

implanting a lightly doped drain region into the semiconductor substrate and substantially aligned with the second sidewall;

depositing an oxide layer to cover the surface of the semiconductor substrate, the first and second sidewalls of the polysilicon electrode and the top surface of the polysilicon electrode;

removing the oxide layer from the top surface of the polysilicon electrode and from above a portion of the surface of the semiconductor substrate outside and spaced from the first and second sidewalls of the polysilicon electrode to form first and second spacers adjacent to the first and second sidewalls, respectively;

implanting a heavily doped drain region into the semiconductor substrate adjacent to and outside of the second spacer and a first portion of a heavily doped source region adjacent to and outside the first spacer;

forming a photoresist layer over the lightly doped drain region, the heavily doped drain region, the second spacer, the second sidewall and a part of the top surface of the polysilicon electrode, the photoresist layer having an opening which exposes a portion of the polysilicon electrode, the first spacer and the first sidewall;

etching the portion oil the polysilicon electrode exposed through the opening in the photoresist layer to form a third sidewall of the polysilicon electrode opposite the second sidewall, thereby eliminating the first sidewall and reducing the length of the polysilicon electrode;

etching the first spacer; and implanting a second portion of a heavily doped source region into the semiconductor substrate and substantially aligned with the third sidewall.

25. The method of claim 24 further including removing the photoresist layer before implanting the heavily doped source region.

26. The method of claim 24 further including removing the photoresist layer after implanting the heavily doped source region.

* * * * *